United States Patent
Liu

(10) Patent No.: US 9,880,439 B2
(45) Date of Patent: Jan. 30, 2018

(54) ARRAY SUBSTRATE, METHOD FOR MANUFACTURING THE SAME, AND DISPLAY DEVICE

(71) Applicant: BOE TECHNOLOGY GROUP CO., LTD., Beijing (CN)

(72) Inventor: Zheng Liu, Beijing (CN)

(73) Assignee: BOE TECHNOLOGY GROUP CO., LTD. (CN)

(*) Notice: Subject to any disclaimer, the term of this patent is extended or adjusted under 35 U.S.C. 154(b) by 0 days.

(21) Appl. No.: 15/309,499

(22) PCT Filed: Mar. 7, 2016

(86) PCT No.: PCT/CN2016/075754
§ 371 (c)(1),
(2) Date: Nov. 8, 2016

(87) PCT Pub. No.: WO2016/173322
PCT Pub. Date: Nov. 3, 2016

(65) Prior Publication Data
US 2017/0184892 A1 Jun. 29, 2017

(30) Foreign Application Priority Data
Apr. 30, 2015 (CN) .......................... 2015 1 0220042

(51) Int. Cl.
G02F 1/1368 (2006.01)
H01L 27/12 (2006.01)
(Continued)

(52) U.S. Cl.
CPC ........ *G02F 1/1368* (2013.01); *G02F 1/13439* (2013.01); *G02F 1/134309* (2013.01);
(Continued)

(58) Field of Classification Search
CPC combination set(s) only.
See application file for complete search history.

(56) References Cited

U.S. PATENT DOCUMENTS

2004/0089878 A1 5/2004 Takehashi et al.
2004/0229408 A1* 11/2004 Chang ................. H01L 27/1214
438/149
(Continued)

FOREIGN PATENT DOCUMENTS

CN 1296643 A 5/2001
CN 1540397 A 10/2004
(Continued)

OTHER PUBLICATIONS

First Office Action for Chinese Application No. 201510220042.0, dated May 27, 2017, 7 Pages.
(Continued)

*Primary Examiner* — Mamadou Diallo
(74) *Attorney, Agent, or Firm* — Brooks Kushman P.C.

(57) ABSTRACT

A method for manufacturing an array substrate, including steps of forming a semiconductor pattern, a gate electrode and a first insulation pattern sequentially on a base substrate at different layers, an orthogonal projection of the semiconductor pattern onto the base substrate covering an orthogonal projection of the first insulation pattern onto the base substrate, and the orthogonal projection of the first insulation pattern onto the base substrate covering an orthogonal projection of the gate electrode onto the base substrate, and subjecting the semiconductor pattern to ion implantation through a single ion implantation process using the first insulation pattern and the gate electrode as a mask plate, so as to form an active layer, a heavily-doped source electrode
(Continued)

region, a lightly-doped source electrode region, a heavily-doped drain electrode region, and a lightly-doped drain electrode region.

19 Claims, 4 Drawing Sheets

(51) Int. Cl.
    *G02F 1/1343* (2006.01)
    *H01L 21/265* (2006.01)
    *H01L 29/786* (2006.01)
    *H01L 29/49* (2006.01)
    *H01L 29/423* (2006.01)
    *H01L 29/167* (2006.01)
    *H01L 29/66* (2006.01)

(52) U.S. Cl.
    CPC ...... *H01L 21/26513* (2013.01); *H01L 27/127* (2013.01); *H01L 27/1255* (2013.01); *H01L 27/1288* (2013.01); *H01L 29/167* (2013.01); *H01L 29/42364* (2013.01); *H01L 29/42372* (2013.01); *H01L 29/4908* (2013.01); *H01L 29/66757* (2013.01); *H01L 29/78621* (2013.01); *H01L 29/78675* (2013.01); *H01L 2029/7863* (2013.01)

(56) References Cited

U.S. PATENT DOCUMENTS

| | | | |
|---|---|---|---|
| 2004/0241918 A1 | 12/2004 | Sera | |
| 2007/0170526 A1 | 7/2007 | Satou | |
| 2013/0286300 A1* | 10/2013 | Lee | G02F 1/13306 349/12 |
| 2014/0225075 A1* | 8/2014 | Zhan | H01L 29/78672 257/40 |
| 2016/0247936 A1* | 8/2016 | Yu | H01L 21/266 |
| 2016/0343746 A1* | 11/2016 | Xue | H01L 27/1288 |
| 2017/0110489 A1* | 4/2017 | Lu | H01L 27/1274 |

FOREIGN PATENT DOCUMENTS

| | | |
|---|---|---|
| CN | 101009331 A | 8/2007 |
| CN | 104916584 A | 9/2015 |

OTHER PUBLICATIONS

International Search Report and Written Opinion for Application No. PCT/CN2016/075754, dated Jun. 15, 2016, 13 Pages.

* cited by examiner

ARRAY SUBSTRATE, METHOD FOR MANUFACTURING THE SAME, AND DISPLAY DEVICE

CROSS-REFERENCE TO RELATED APPLICATIONS

This application is the U.S. national phase of PCT Application No. PCT/CN2016/075754 filed on Mar. 7, 2016, which claims priority to Chinese Patent Application No. 201510220042.0 filed on Apr. 30, 2015, the disclosures of which are incorporated in their entirety by reference herein.

TECHNICAL FIELD

The present disclosure relates to the field of manufacture of a liquid crystal display device, in particular to an array substrate, a method for manufacturing the same, and a display device.

BACKGROUND

For a liquid crystal display (LCD) or an organic light-emitting diode (OLED) display, each pixel is driven by a thin film transistor (TFT) arranged behind the pixel, so as to display screen information at a high speed, a high brightness and a high contrast. In the related art, the TFT is usually manufactured by poly silicon (poly-Si) or amorphous silicon (a-Si). The poly-Si has a carrier mobility of 10-200 $cm^2/V$, which is obviously greater than a carrier mobility (1 $cm^2/V$) of the a-Si, so the poly-Si has higher capacitive and storage properties than the a-Si. For the LCD and the OLED display, the TFT is generally formed on a glass substrate. Due to thermodynamic limitations of glass, a crystalline characteristic of the poly-Si TFT and an annealing procedure after ion implantation may not recover effectively. In the case of a reversed bias voltage, a relatively large drain current may occur, and thereby the normal operation of the TFT will be adversely affected.

In order to suppress the drain current of the TFT, usually a lightly-doped region and a heavily-doped region are arranged on a source electrode and a drain electrode of the TFT respectively. A voltage may be partially applied to the lightly-doped region, so a part of the drain current may be cancelled out.

Currently, for the LCD, usually an additional ion implantation process is provided. In other words, after a gate metal layer has been etched, a lightly-doping procedure is performed at first using a gate electrode, and then a heavily-doping procedure is performed through an additional masking process using an image-reversal photoresist (PR) as a mask plate. It is found that, at least two ion implantation processes are required during the manufacture. However, the ion implantation process is time-consuming and expensive, and as a result, the mass production of the array substrate will be adversely affected.

SUMMARY

(1) Technical Problem to be Solved

An object of the present disclosure is to provide an array substrate, a method for manufacturing the same and a display device, so as to form a source electrode and a drain electrode of a TFT each with a lightly-doped region and a heavily-doped region through a single ion implantation process.

(2) Technical Solution

In one aspect, the present disclosure provides in some embodiments a method for manufacturing an array substrate, including steps of: forming a semiconductor pattern, a gate electrode and a first insulation pattern sequentially on a base substrate at different layers, the semiconductor pattern being insulated from the gate electrode, an orthogonal projection of the semiconductor pattern onto the base substrate covering an orthogonal projection of the first insulation pattern onto the base substrate, and the orthogonal projection of the first insulation pattern onto the base substrate covering an orthogonal projection of the gate electrode onto the base substrate; and subjecting the semiconductor pattern to ion implantation through a single ion implantation process using the first insulation pattern and the gate electrode as a mask plate, to form an active layer, a heavily-doped source electrode region, a lightly-doped source electrode region, a heavily-doped drain electrode region, and a lightly-doped drain electrode region. Subsequent to the ion implantation, an orthogonal projection of the active layer onto the base substrate fully overlaps the orthogonal projection of the gate electrode onto the base substrate, orthogonal projections of the lightly-doped source electrode region and the lightly-doped drain electrode region onto the base substrate overlap the orthogonal projection of the first insulation pattern onto the base substrate rather than the orthogonal projection of the gate electrode onto the base substrate, and orthogonal projections of the heavily-doped source electrode region and the heavily-doped drain electrode region onto the base substrate do not overlap the orthogonal projection of the first insulation pattern onto the base substrate and the orthogonal projection of the gate electrode onto the base substrate.

Optionally, the method further includes forming a storage capacitor, which includes an upper polar plate, a lower polar plate, and a second insulation pattern for separating the upper polar plate from the lower polar plate. The lower polar plate is made of an identical material and arranged at an identical layer to the gate electrode, and the first insulation pattern is made of an identical material and arranged at an identical layer to the second insulation pattern.

Optionally, the method further includes: forming the semiconductor pattern on the base substrate; forming a first insulation layer on the base substrate with the semiconductor pattern; forming the gate electrode and the lower polar plate made of an identical material and arranged at an identical layer on the base substrate with the first insulation layer; forming the first insulation pattern and the second insulation pattern made of the second insulation layer on the base substrate with the gate electrode and the lower polar plate, the first insulation pattern covering the gate electrode, and the second insulation pattern covering the lower polar plate; subjecting the semiconductor pattern to ion implantation through a single ion implantation process using the first insulation pattern and the gate electrode as a mask plate, to form the active layer, the heavily-doped source electrode region and the lightly-doped source electrode region, and the heavily-doped drain electrode region and the lightly-doped drain electrode region; and forming the upper polar plate on the second insulation pattern.

Optionally, a patterning process for forming the first insulation pattern and the second insulation pattern and a patterning process for forming the upper polar plate use a same mask plate.

Optionally, the gate electrode is made of molybdenum and/or aluminum, and has a thickness of 1000 Å to 5000 Å.

The first insulation layer is made of silicon dioxide and/or silicon nitride, and has a thickness of 500 Å to 2000 Å.

Optionally, the gate electrode has a thickness of 1500 Å to 4000 Å, and the first insulation layer has a thickness of 600 Å to 1500 Å. The ion implantation is performed using a gas containing boron and/or phosphorus as an implantation media, at an implantation energy of 10 to 200 KeV and at an implantation dosage of $1*10^{11}$ to $1*10^{20}$ atoms/cm$^3$.

In another aspect, the present disclosure provides in some embodiments an array substrate manufactured by the above-mentioned method. The array substrate includes a base substrate, and a TFT formed on the base substrate. The TFT includes a gate electrode, a source electrode, a drain electrode and an active layer. The source electrode includes a heavily-doped source electrode region and a lightly-doped source electrode region, and the drain electrode includes a heavily-doped drain electrode region and a lightly-doped drain electrode region. The array substrate further includes a first insulation pattern arranged above the gate electrode, and an orthogonal projection of the first insulation pattern onto the base substrate covering an orthogonal projection of the gate electrode onto the base substrate. An orthogonal projection of the active layer onto the base substrate fully overlaps the orthogonal projection of the gate electrode onto the base substrate, orthogonal projections of the lightly-doped source electrode region and the lightly-doped drain electrode region onto the base substrate overlap the orthogonal projection of the first insulation pattern onto the base substrate rather than the orthogonal projection of the gate electrode onto the base substrate, and orthogonal projections of the heavily-doped source electrode region and the heavily-doped drain electrode region onto the base substrate do not overlap the orthogonal projection of the first insulation pattern onto the base substrate and the orthogonal projection of the gate electrode onto the base substrate.

Optionally, the array substrate further includes a storage capacitor formed on the base substrate. The storage capacitor includes an upper polar plate, a lower polar plate, and a second insulation pattern for separating the upper polar plate from the lower polar plate. The lower polar plate is made of an identical material and arranged at an identical layer to the gate electrode, and the first insulation pattern is made of an identical material and arranged at an identical layer to the second insulation pattern.

In yet another aspect, the present disclosure provides in some embodiments a display device including the above-mentioned array substrate.

(3) Beneficial Effect

According to the embodiments of the present disclosure, the lightly-doped region and the heavily-doped region may be formed on each of the source electrode and the drain electrode of the TFT merely through a single ion implantation process. In this way, it is able to reduce the manufacturing time, thereby to reduce the manufacture cost. In addition, through the lightly-doped region and the heavily-doped region formed on each of the source electrode and the drain electrode of the TFT, it is able to reduce the drain current, thereby to improve the operation stability of the display device.

BRIEF DESCRIPTION OF THE DRAWINGS

In order to illustrate the technical solutions in the embodiments of the present disclosure or the related art in a clearer manner, the drawings desired for the present disclosure or the related art will be described briefly hereinafter. Obviously, the following drawings merely relate to parts of the embodiments of the present disclosure, and a person skilled in the art may, without any creative effort, acquire the other drawings based on these drawings.

DETAILED DESCRIPTION

The present disclosure will be described hereinafter in conjunction with the drawings and embodiments. The following embodiments are for illustrative purposes only, but shall not be used to limit the scope of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
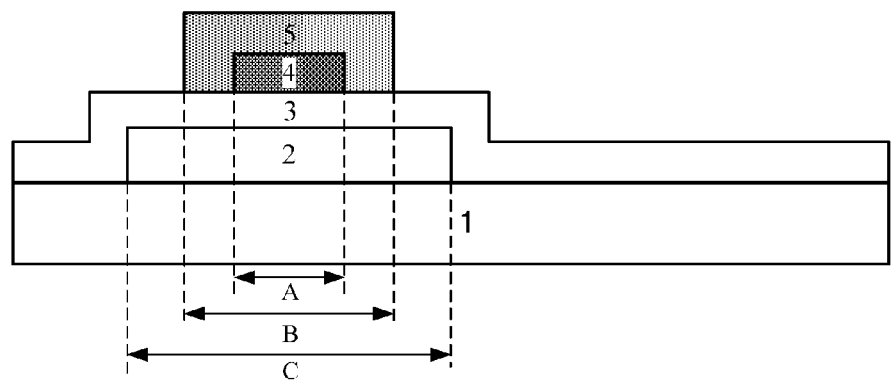
FIGS. 1 and 2 are schematic views showing a method for manufacturing an array substrate according to one embodiment of the present disclosure.
Figure 2:
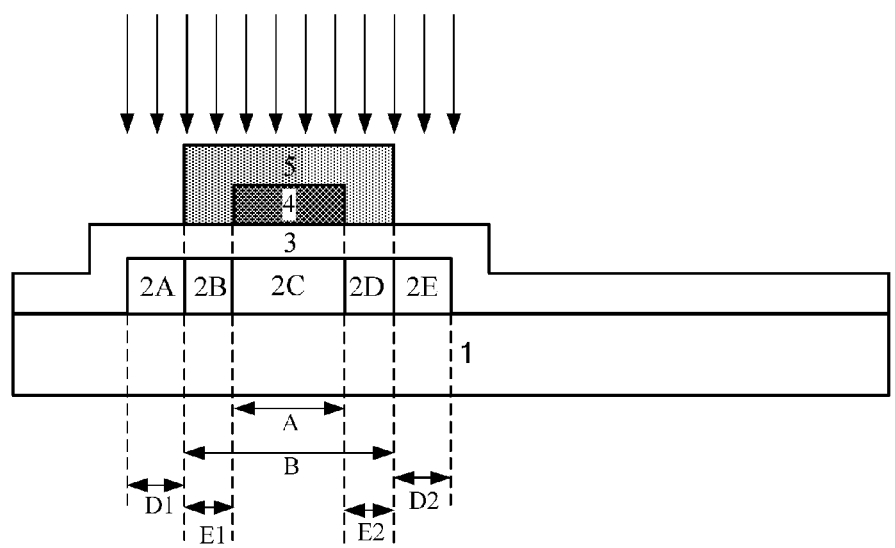

As shown in FIGS. 1 and 2, the present disclosure provides in some embodiments a method for manufacturing an array substrate, which includes steps of: forming a semiconductor pattern 2, a gate electrode 4 and a first insulation pattern 5 sequentially on a base substrate 1 at different layers, the semiconductor pattern 2 being insulated from the gate electrode 4, an orthogonal projection C of the semiconductor pattern 2 onto the base substrate 1 covering an orthogonal projection B of the first insulation pattern 5 onto the base substrate 1, and the orthogonal projection B of the first insulation pattern 5 onto the base substrate 1 covering an orthogonal projection A of the gate electrode 4 onto the base substrate 1; and subjecting the semiconductor pattern 2 to ion implantation through a single ion implantation process using the first insulation pattern 5 and the gate electrode 4 as a mask plate, so as to form an active layer 2C, a heavily-doped source electrode region 2A, a lightly-doped source electrode region 2B, a heavily-doped drain electrode region 2D, and a lightly-doped drain electrode region 2E.

Subsequent to the ion implantation, an orthogonal projection of the active layer 2C onto the base substrate 1 fully overlaps the orthogonal projection A of the gate electrode 4 onto the base substrate 1, orthogonal projections E1, E2 of the lightly-doped source electrode region 2B and the lightly-doped drain electrode region 2D onto the base substrate 1 overlaps the orthogonal projection B of the first insulation pattern 5 onto the base substrate 1 rather than the orthogonal projection A of the gate electrode 4 onto the base substrate 1, and orthogonal projections D1, D2 of the heavily-doped source electrode region 2A and the heavily-doped drain electrode region 2E onto the base substrate 1 do not overlap the orthogonal projection B of the first insulation pattern 5 onto the base substrate 1 and the orthogonal projection A of the gate electrode 4 onto the base substrate 1.

According to the method in the embodiments of the present disclosure, a source electrode and a drain electrode each having the lightly-doped region and heavily-doped region may be formed merely through a single ion implantation process. In this way, it is able to reduce the manufacturing time, thereby to reduce the manufacture cost. In addition, through the lightly-doped regions and heavily-doped regions, it is able to reduce the drain current, thereby to improve the operation stability of a display panel.

During the manufacture, for the array substrate with a low-temperature poly-Si TFT, a storage capacitor (Cs) also needs to be provided, so as to meet the requirement of driving liquid crystals. The storage capacitor includes an upper polar plate, a lower polar plate, and a second insulation pattern for separating the upper polar plate from the lower polar plate. Currently, the lower polar plate of the storage capacitor also needs to be formed after the ion implantation. The semiconductor pattern of the TFT is located at a region different from the lower polar plate of the storage capacitor, so in the related art, two ion implantation processes with different mask plates need to be adopted, and the ion implantation processes may be time-consuming. In order to improve the manufacture efficiency and reduce the manufacture cost, the lower polar plate of the storage capacitor may be formed in an identical ion implantation process.

The method will be described hereinafter in more details in conjunction with FIG. 3.

As shown in FIG. 3, the method for manufacturing the array substrate with the low-temperature poly-Si TFT may include the following steps.

Figure 3A:
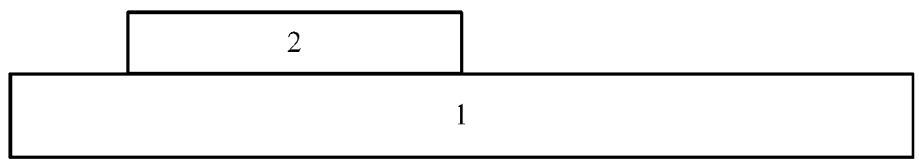
FIGS. 3A to 3F are schematic views showing the method for manufacturing the array substrate according to one embodiment of the present disclosure.

Step 1: as shown in FIG. 3A, forming the semiconductor pattern 2 on the base substrate 1. The semiconductor pattern 2 may have a thickness of 100 Å to 3000 Å, and optionally 500 Å to 1000 Å. To be specific, a semiconductor material layer may be deposited onto the base substrate 1 through plasma enhanced chemical vapor deposition (PECVD), low-pressure chemical vapor deposition (LPCVD) or sputtering, and then treated with a patterning process, so as to form the semiconductor pattern 2.

Of course, optionally, a buffer layer may be deposited onto the base substrate 1, and then the semiconductor pattern 2 may be formed subsequently. The buffer layer functions as to prevent impurities in the base substrate 1 from entering the active layer of the TFT, thereby to prevent characteristics of the TFT, e.g., a threshold voltage and a leakage current, from being changed.

Figure 3B:
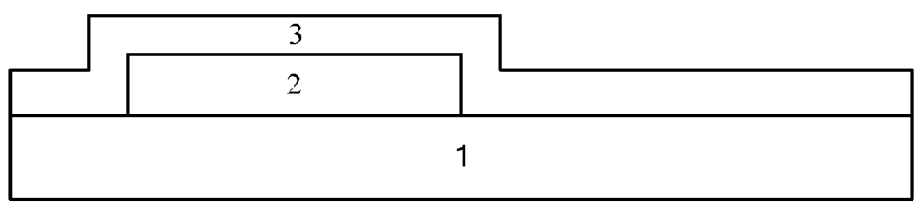

Step 2: as shown in FIG. 3B, forming a first insulation layer 3 on the base substrate 1 with the semiconductor pattern 2. The first insulation layer 3 may be of a single layer made of silicon dioxide or silicon nitride, or a double-layered structure consisting of the two layers. According to the practical need, the first insulation layer 3 may have a thickness of 500 Å to 2000 Å, optionally 600 Å to 1500 Å.

Figure 3C:
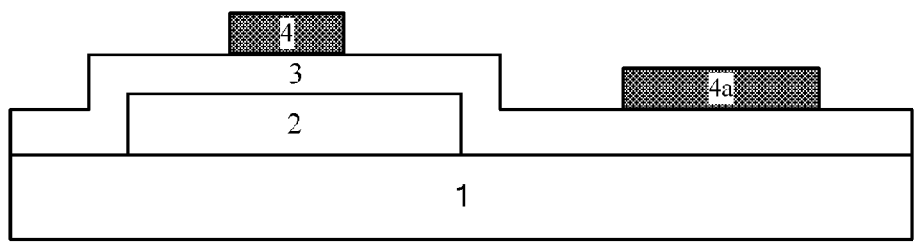

Step 3: as shown in FIG. 3C, forming the gate electrode 4 and the lower polar plate 4a made of an identical material and arranged at an identical layer on the base substrate 1 with the first insulation layer 3. The gate electrode 4 and the lower polar plate 4a may each be of a structure consisting of one, two or more layers. They may be made of metal or a metal alloy, e.g., molybdenum, aluminum, or a molybdenum-tungsten alloy. The gate electrode 4 and the lower polar plate 4a may each have a thickness of 1000 Å to 5000 Å, optionally 1500 Å to 4000 Å.

Figure 3D:
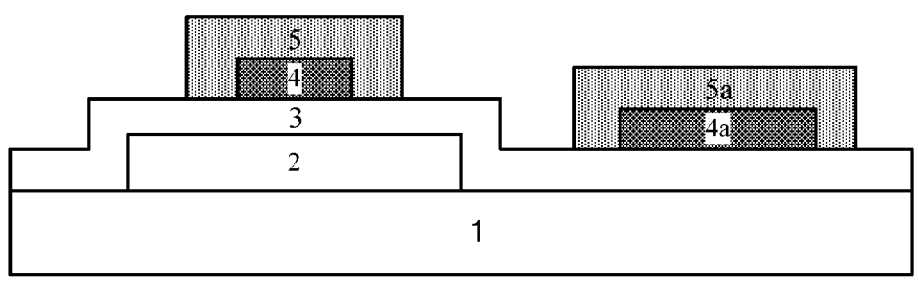

Step 4: as shown in FIG. 3D, forming a first insulation pattern 5 and a second insulation pattern 5a on the base substrate 1 with the gate electrode 4 and the lower polar plate 4a, and the first insulation pattern 5 and the second insulation pattern 5a being created from a second insulation layer. The first insulation pattern 5 covers the gate electrode 4, and the second insulation pattern 5a covers the lower polar plate 4a. The second insulation layer may be formed in a way identical to the first insulation layer 3.

It should be appreciated that, for the conventional TFT, a gate insulation layer for protection, i.e., the second insulation layer, may be arranged above the gate electrode, and the entire second insulation layer may be formed merely through deposition. However, in the embodiments of the present disclosure, the second insulation layer further needs to be treated by a patterning process, so as to form the first insulation pattern 5 which may serve as a mask plate during the ion implantation.

Figure 3E:
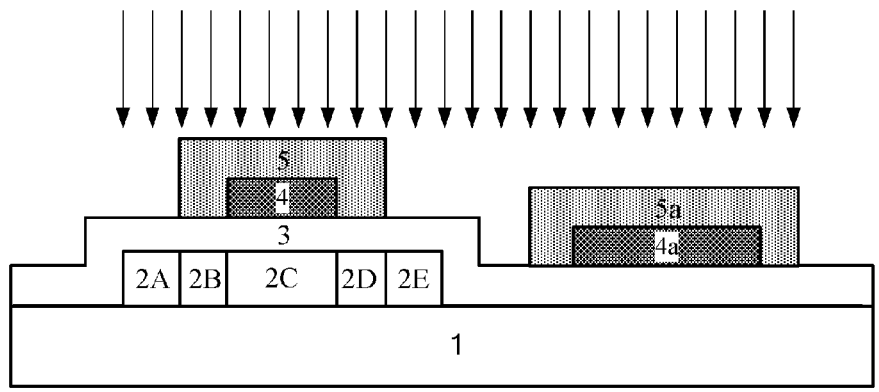

Step 5: as shown in FIG. 3E, subjecting the semiconductor pattern to ion implantation through a single ion implantation process using the first insulation pattern 5 and the gate electrode 4 as a mask plate, so as to form the active layer 2C, the heavily-doped source electrode region 2A, the lightly-doped source electrode region 2B, the heavily-doped drain electrode region 2D and the lightly-doped drain electrode region 2E. In addition, during the ion implantation, ions may also be implanted into the lower polar plate 4a. The ion implantation is performed using a gas containing boron and/or phosphorus as an implantation media, at an implantation energy of 10 to 200 KeV and at an implantation dosage of $1*10^{11}$ to $1*10^{20}$ atoms/cm$^3$.

During the ion implantation, it is able to block a part of the ions by each of the first insulation pattern 5 and the gate electrode 4, and through the cooperation of them, it is able to block all the ions. Through the first insulation pattern 5 and the gate electrode 4, it is able to form a half-blocking mask plate, a fully-blocking mask plate and an unblocking mask plate with different ion-implantation rates, thereby to provide the semiconductor pattern with three regions with different conductivities, i.e., the heavily-doped region with the highest conductivity, the lightly-doped region with the second highest conductivity, and the active layer with the lowest conductivity.

Figure 3F:
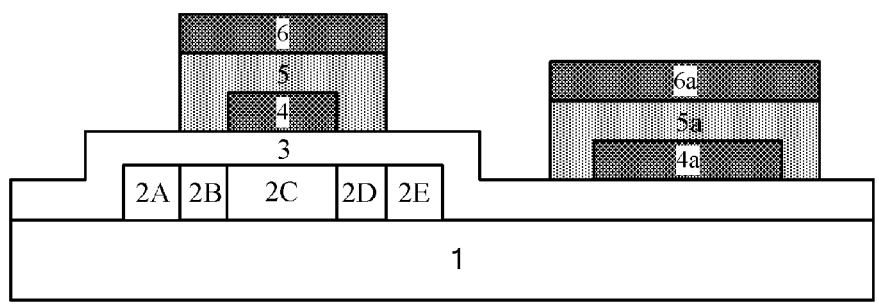

Step 6: as shown in FIG. 3F, forming the upper polar plate 6a of the storage capacitor on the second insulation pattern 5a. In order to reduce the manufacture cost, the upper polar plate 6a may be formed using the mask plate that has been used to form the first insulation pattern 5 and the second insulation pattern 5a. In this way, the upper polar plate 6a of the storage capacitor may have a pattern identical to that of the second insulation pattern 5a, and a layer made of a material identical to the upper polar plate 6a, i.e., a conductive pattern 6 identical to the first insulation pattern 5, may not be etched off and thus reserved above the first insulation pattern 5 (the conductive pattern 6 may be or may not be removed).

The above are the illustrative steps of the method for manufacturing the array substrate. As compared with the related art, it is able for the method in the embodiments of the present disclosure to, merely through a single ion implantation process, form the heavily-doped region and the lightly-doped region on each of the source electrode and the drain electrode of the TFT, and meanwhile subject the lower polar plate of the storage capacitor to the ion implantation. In addition, in the embodiments of the present disclosure, although the second insulation layer covering the gate electrode and the lower polar plate needs to be treated through a patterning process, it may share an identical mask plate with the upper polar plate 6a, i.e., it is unnecessary to provide an additional mask plate as compared with the related art.

Figure 5:
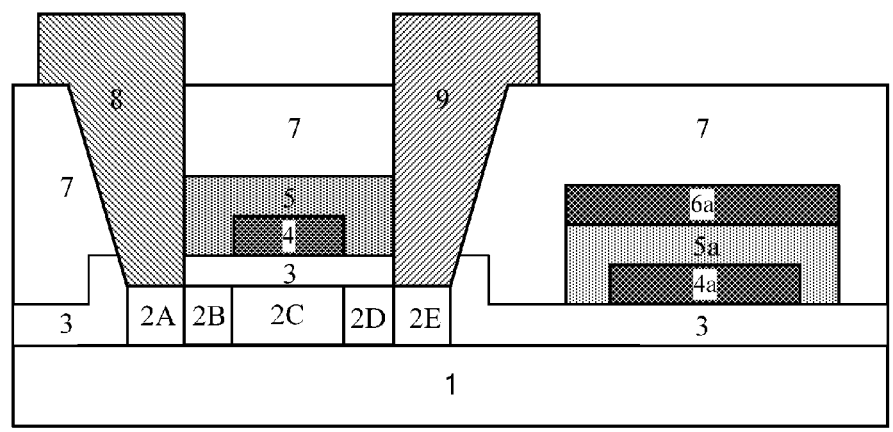
FIG. 5 is another schematic view showing the array substrate according to one embodiment of the present disclosure.

Of course, referring to FIG. 5, the method may further include forming a third insulation layer 7, forming via-holes in the third insulation layer 7, and then forming conductive patterns 8, 9. The conductive pattern 8 may be connected to the heavily-doped source electrode region 2A through one of the via-holes in the third insulation layer 7, so as to form the source electrode of the TFT together with the heavily-doped source electrode region 2A and the lightly-doped source electrode region 2B. Identically, the conductive pattern 9 may be connected to the heavily-doped drain electrode region 2E through the other of the via-holes in the third insulation layer 7, so as to form the drain electrode of the TFT together with the heavily-doped drain electrode region 2E and the lightly-doped drain electrode region 2D.

Figure 4:
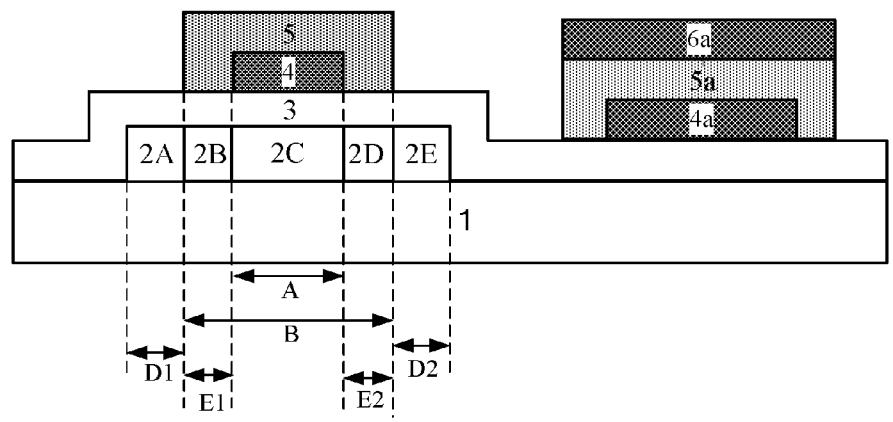
FIG. 4 is a schematic view showing the array substrate according to one embodiment of the present disclosure.

As shown in FIG. 4, the present disclosure provides in some embodiments an array substrate manufactured by the above-mentioned method. The array substrate includes: a base substrate 1, and a TFT formed on the base substrate 1. The TFT includes a gate electrode 4, a source electrode, a drain electrode and an active layer 2C. The source electrode includes a heavily-doped source electrode region 2A and a lightly-doped source electrode region 2B, and the drain electrode includes a heavily-doped drain electrode region 2D and a lightly-doped drain electrode region 2E. The array substrate further includes a first insulation pattern 5 which is arranged above the gate electrode 4, and an orthogonal projection B of which onto the base substrate 1 covers an orthogonal projection A of the gate electrode e onto the base substrate 1.

An orthogonal projection of the active layer 2C onto the base substrate 1 fully overlaps the orthogonal projection A of the gate electrode 4 onto the base substrate 1, orthogonal projections E1, E2 of the lightly-doped source electrode region 2B and the lightly-doped drain electrode region 2D onto the base substrate 1 overlap the orthogonal projection B of the first insulation pattern 5 onto the base substrate 1 rather than the orthogonal projection A of the gate electrode 4 onto the base substrate 1, and orthogonal projections D1, D2 of the heavily-doped source electrode region 2A and the heavily-doped drain electrode region 2E onto the base substrate 1 do not overlap the orthogonal projection B of the first insulation pattern 5 onto the base substrate 1 and the orthogonal projection A of the gate electrode 4 onto the base substrate 1.

According to the array substrate in the embodiments of the present disclosure, the source electrode and the drain electrode each having the lightly-doped region and heavily-doped region may be formed merely through a single ion implantation process. In this way, it is able to reduce the manufacturing time, thereby to reduce the manufacture cost.

In the embodiments of the present disclosure, the array substrate further includes a storage capacitor formed on the base substrate 1. The storage capacitor includes an upper polar plate 6a, a lower polar plate 4a, and a second insulation pattern 5a for separating the upper polar plate 6a from the lower polar plate 4a. The upper polar plate 4a is made of an identical material and arranged at an identical layer to the gate electrode 4, and the first insulation pattern 5 is made of an identical material and arranged at an identical layer to the second insulation pattern 5a.

Referring to FIG. 5, the array substrate further includes a third insulation layer 7 with via-holes, and conductive patterns 8, 9.

The conductive pattern 8 is connected to the heavily-doped source electrode region 2A through one of the via-holes in the third insulation layer 7, so as to form the source electrode of the TFT together with the heavily-doped source electrode region 2A and the lightly-doped source electrode region 2B. Identically, the conductive pattern 9 is connected to the heavily-doped drain electrode region 2E through the other of the via-holes in the third insulation layer 7, so as to form the drain electrode of the TFT together with the heavily-doped drain electrode region 2E and the lightly-doped drain electrode region 2D.

The present disclosure further provides in some embodiments a display device including the above-mentioned array substrate. Here, the display device may be a display panel only, or a display device including the display panel. The display device may be any product or member having a display function, such as a liquid crystal panel, a liquid crystal display device, an organic light-emitting diode (OLED) display panel, an OLED display device, an electronic paper, or a digital photo frame.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A method for manufacturing an array substrate, comprising steps of:
   forming a semiconductor pattern, a gate electrode and a first insulation pattern sequentially on a base substrate at different layers, the semiconductor pattern being insulated from the gate electrode, an orthogonal projection of the semiconductor pattern onto the base substrate covering an orthogonal projection of the first insulation pattern onto the base substrate, and the orthogonal projection of the first insulation pattern onto the base substrate covering an orthogonal projection of the gate electrode onto the base substrate; and
   subjecting the semiconductor pattern to ion implantation through a single ion implantation process using the first insulation pattern and the gate electrode as a mask plate, to form an active layer, a heavily-doped source electrode region, a lightly-doped source electrode region, a heavily-doped drain electrode region, and a lightly-doped drain electrode region,
   wherein subsequent to the ion implantation, an orthogonal projection of the active layer onto the base substrate fully overlaps the orthogonal projection of the gate electrode onto the base substrate, orthogonal projections of the lightly-doped source electrode region and the lightly-doped drain electrode region onto the base substrate overlap the orthogonal projection of the first insulation pattern onto the base substrate rather than the orthogonal projection of the gate electrode onto the base substrate, and orthogonal projections of the heavily-doped source electrode region and the heavily-doped drain electrode region onto the base substrate do not overlap the orthogonal projection of the first insulation pattern onto the base substrate and the orthogonal projection of the gate electrode onto the base substrate.

2. The method according to claim 1, further comprising forming a storage capacitor including an upper polar plate, a lower polar plate, and a second insulation pattern for separating the upper polar plate from the lower polar plate, wherein the lower polar plate is made of an identical material and arranged at an identical layer to the gate electrode, and the first insulation pattern is made of an identical material and arranged at an identical layer to the second insulation pattern.

3. The method according to claim 2, further comprising:
forming the semiconductor pattern on the base substrate;
forming a first insulation layer on the base substrate with the semiconductor pattern;
forming the gate electrode and the lower polar plate made of an identical material and arranged at an identical layer on the base substrate with the first insulation layer;
forming the first insulation pattern and the second insulation pattern made of the second insulation layer on the base substrate with the gate electrode and the lower polar plate, the first insulation pattern covering the gate electrode, and the second insulation pattern covering the lower polar plate;
subjecting the semiconductor pattern to ion implantation through a single ion implantation process using the first insulation pattern and the gate electrode as a mask plate, to form the active layer, the heavily-doped source electrode region and the lightly-doped source electrode region, and the heavily-doped drain electrode region and the lightly-doped drain electrode region; and
forming the upper polar plate on the second insulation pattern.

4. The method according to claim 3, wherein the first insulation layer is made of silicon dioxide and/or silicon nitride, and has a thickness of 500 Å to 2000 Å.

5. The method according to claim 4, wherein the first insulation layer has a thickness of 600 Å to 1500 Å.

6. The method according to claim 3, wherein a patterning process for forming the first insulation pattern and the second insulation pattern and a patterning process for forming the upper polar plate use a same mask plate.

7. The method according to claim 3, wherein the gate electrode is made of molybdenum and/or aluminum, and has a thickness of 1000 Å to 5000 Å.

8. The method according to claim 2, wherein a patterning process for forming the first insulation pattern and the second insulation pattern and a patterning process for forming the upper polar plate use a same mask plate.

9. The method according to claim 8, wherein the gate electrode is made of molybdenum and/or aluminum, and has a thickness of 1000 Å to 5000 Å.

10. The method according to claim 8, wherein the first insulation layer is made of silicon dioxide and/or silicon nitride, and has a thickness of 500 Å to 2000 Å.

11. The method according to claim 2, wherein the gate electrode is made of molybdenum and/or aluminum, and has a thickness of 1000 Å to 5000 Å.

12. The method according to claim 1, wherein the gate electrode is made of molybdenum and/or aluminum, and has a thickness of 1000 Å to 5000 Å.

13. The method according to claim 12, wherein the gate electrode has a thickness of 1500 Å to 4000 Å.

14. The method according to claim 1, wherein the ion implantation is performed using a gas containing boron and/or phosphorus as an implantation media, at an implantation energy of 10 to 200 KeV and at an implantation dosage of $1*10^{11}$ to $1*10^{20}$ atoms/cm3.

15. An array substrate, comprising:
a base substrate,
a thin film transistor (TFT) formed on the base substrate, the TFT comprising a gate electrode, a source electrode, a drain electrode and an active layer, the source electrode comprising a heavily-doped source electrode region and a lightly-doped source electrode region, and the drain electrode comprising a heavily-doped drain electrode region and a lightly-doped drain electrode region;
a first insulation pattern arranged above the gate electrode, and an orthogonal projection of the first insulation pattern onto the base substrate covering an orthogonal projection of the gate electrode onto the base substrate; and
a storage capacitor formed on the base substrate,
wherein an orthogonal projection of the active layer onto the base substrate fully overlaps the orthogonal projection of the gate electrode onto the base substrate, orthogonal projections of the lightly-doped source electrode region and the lightly-doped drain electrode region onto the base substrate overlap the orthogonal projection of the first insulation pattern onto the base substrate rather than the orthogonal projection of the gate electrode onto the base substrate, and orthogonal projections of the heavily-doped source electrode region and the heavily-doped drain electrode region onto the base substrate do not overlap the orthogonal projection of the first insulation pattern onto the base substrate and the orthogonal projection of the gate electrode onto the base substrate,
wherein the storage capacitor comprises an upper polar plate, a lower polar plate, a second insulation pattern for separating the upper polar plate from the lower polar plate, the lower polar plate is made of an identical material and arranged at an identical layer to the gate electrode, and the first insulation pattern is made of an identical material and arranged at an identical layer to the second insulation pattern.

16. The array substrate according to claim 15, wherein the gate electrode is made of molybdenum and/or aluminum, and has a thickness of 1000 Å to 5000 Å.

17. The array substrate according to claim 16, wherein the gate electrode has a thickness of 1500 Å to 4000 Å.

18. The array substrate according to claim 15, wherein the lower polar plate and the gate electrode is each of a structure consisting of one, two or more layers.

19. A display device, comprising the array substrate according to claim 15.

* * * * *